(12) United States Patent
Lin

(10) Patent No.: US 10,796,913 B2
(45) Date of Patent: Oct. 6, 2020

(54) METHOD FOR HYBRID WAFER-TO-WAFER BONDING

(71) Applicant: SHANGHAI IC R&D CENTER CO., LTD., Shanghai (CN)

(72) Inventor: Hong Lin, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/330,087

(22) PCT Filed: Jun. 6, 2017

(86) PCT No.: PCT/CN2017/087280
§ 371 (c)(1),
(2) Date: Mar. 3, 2019

(87) PCT Pub. No.: WO2018/076700
PCT Pub. Date: May 3, 2018

(65) Prior Publication Data
US 2019/0214257 A1 Jul. 11, 2019

(30) Foreign Application Priority Data
Oct. 26, 2016 (CN) .......................... 2016 1 0948181

(51) Int. Cl.
*H01L 21/00* (2006.01)
*H01L 21/18* (2006.01)
(Continued)

(52) U.S. Cl.
CPC .......... *H01L 21/185* (2013.01); *H01L 21/324* (2013.01); *H01L 21/76876* (2013.01); *H01L 21/76895* (2013.01)

(58) Field of Classification Search
CPC ................ H01L 21/185; H01L 21/324; H01L 21/76876; H01L 21/76895;
(Continued)

(56) References Cited

U.S. PATENT DOCUMENTS 6,838,774 B2 * 1/2005 Patti .................. H01L 21/76898
257/737
8,268,699 B2 * 9/2012 Park ...................... H01L 21/187
438/455
(Continued)

*Primary Examiner* — Nikolay K Yushin
(74) *Attorney, Agent, or Firm* — Tianchen LLC; Yuan R. Li; Yi Fan Yin

(57) ABSTRACT

A method for hybrid wafer-to-wafer bonding, comprising: providing two silicon wafers with Cu pattern structures, a conventional Cu BEOL process is adopted on the silicon wafers to obtain the planarized surface with copper and dielectric; removing part of the Cu on the planarized surface of the Cu pattern structures by adopting an etching process to form a certain amount of Cu recesses; depositing a layer of bonding metal on the surface of the Cu by adopting a selective deposition process; performing surface activation on the bonding metal and the dielectric by adopting a surface activation process; aligning and pressing the two silicon wafers together to obtain the dielectric bonding; and obtaining the metal bonding through the annealing process. The sufficient metal bonding can be obtained at low annealing temperature according to the present invent, thereby the risk of dielectric delaminating caused by thermal expansion mismatch is reduced, which is conducive to reduce the difficulty of process integration, save process time and improve product yield.

10 Claims, 3 Drawing Sheets

(51) Int. Cl.
*H01L 21/768* (2006.01)
*H01L 21/324* (2006.01)

(58) Field of Classification Search
CPC ....... H01L 21/823871; H01L 21/76898; H01L 21/76877; H01L 21/02625; H01L 21/76879; H01L 24/83; H01L 24/80; H01L 24/08; H01L 24/00; H01L 24/94; H01L 24/03; H01L 24/05; H01L 2224/08145; H01L 2224/83896; H01L 2224/32145; H01L 2224/05647
See application file for complete search history.

(56) References Cited

U.S. PATENT DOCUMENTS

| | | | |
|---|---|---|---|
| 8,482,132 B2* | 7/2013 | Yang | H01L 24/92 257/777 |
| 2004/0048459 A1* | 3/2004 | Patti | H01L 21/76898 438/612 |
| 2009/0252939 A1* | 10/2009 | Park | H01L 21/187 428/212 |
| 2017/0186730 A1* | 6/2017 | Shen | H01L 21/568 |

* cited by examiner

METHOD FOR HYBRID WAFER-TO-WAFER BONDING

CROSS-REFERENCE TO RELATED APPLICATION

This application claims the priority benefit of International Patent Application Serial No. PCT/CN2017/087280, filed Jun. 6, 2017, which is related to and claims the priority benefit of China patent application serial No. 201610948181.X, filed Oct. 26, 2016. The entirety of each of the above-mentioned patent applications is hereby incorporated by reference herein and made a part of this specification.

FIELD OF THE INVENTION

The invention relates to the field of integrated circuit manufacturing technology, and more specifically, relates to a wafer-wafer bonding method adopting a hybrid bonding mode.

BACKGROUND OF THE INVENTION

With the integrated circuit manufacturing technology entering into 45 nm and the following generation, in order to overcome technical problems caused by feature size reduction, the industry has generally adopted some new technologies, such as a strain silicon engineering, a high dielectric constant dielectric/metal gate electrode, a multi-exposure technology, etc., and entering into the 16 nm node technology, the traditional two-dimensional CMOS device is turning also to the three-dimensional FinFET device. The high investment and high risk of these cutting-edge technologies have excluded many small and medium-sized integrated circuit manufacturers. In their quest for survival, a technological revolution is afoot as manufacturers who have been knocked out have had to find another way. The three-dimensional integrated circuit has been recognized as a next generation semiconductor technology, which has the advantage of high performance, low power consumption, small physical size and high integration density. How to achieve vertical interconnection is a key of three-dimensional integration, and the core technology is Stacked Bonding technology and Through Silicon Via (TSV) technology.

Method for manufacturing stacked bonding is generally three, namely chip-to-chip bonding, chip-to-wafer bonding, and wafer-to-wafer bonding. The chip-to-chip bonding is the most currently adopted method, which is used in mass production by packaging manufacturers. Although the yield of the chip-to-chip bonding is high, the dicing and testing need to take a lot of time and resources, so the manufacturing cost is very high. According to the chip-to-wafer bonding technology, one product wafer with a low yield can be subjected to dicing and detecting, and then the good chips selected are bonded to another product wafer with a relatively high yield, in order to reduce part of the process steps, so relative cost savings; the method is a future technical trend of the packaging factory. The wafer-to-wafer bonding is suitable for integration of similar products with a high yield, and the production efficiency can be maximized, the technological process is simplified, and the cost is minimized. But if the yield of the silicon wafers is not high or unstable, the number of KGD (known good die) will be limited, which will affect the qualified rate of wafer-to-wafer bonding. For this reason, the wafer-to-wafer bonding is what the main direction of chip manufacturers are focused on, which can give full play to the production capacity of backward technology. From the perspective of future large-scale production applications, the wafer-to-wafer bonding and the chip-wafer bonding technologies will become the mainstream solutions for the three-dimensional integration.

The wafer-to-wafer bonding would be to achieve physical bonding between the silicon wafers by adopting silicon wafer-level bonding technology, and even obtain the electric connection between the silicon wafers directly. The silicon wafer level bonding technology in the three-dimensional integration comprises adhesive bonding, metal diffusion bonding, eutectic bonding, silicon direct bonding, hybrid bonding and the like. Among them, the hybrid bonding is an emerging technology, and will become a high yield and high-reliability bonding technology with great potential. The hybrid bonding combines dielectric-dielectric bonding with metal-metal bonding. While achieving vertical metal interconnection, the physical and mechanical properties between 3D stacked chips are enhanced by the auxiliary effect of dielectric adhesion. Due to the simultaneous electrical interconnection and micro-pore dielectric filling, the hybrid bonding technology can effectively simplify the 3D process and avoid the technical challenge of the micro-pore filling caused by the shrink of characteristic size. Therefore, the hybrid bonding technology can be applied to the wafer-to-wafer bonding process with high integration density.

For the wafer-to-wafer bonding processes with high integration density requirement, the hybrid bonding should be realized by low-temperature dielectric-activated bonding process which is difficulty to integrate, and the inorganic dielectric such as $SiO_2$, $Si_3N_4$ and like should be used as bonding materials. To obtain a co-bonding of the metal and the dielectric, a conventional Cu interconnection layer process is completed in a Cu BEOL, and finally the Cu CMP process of the Cu interconnection layer at the uppermost layer is executed to expose the Cu and $SiO_2$ dielectric. And then the dielectric surface is activated through a plasma activating technology; when the two silicon wafers are in contact with each other, the dielectric surface can be subjected to relative strong physical bonding at room temperature; and then the Cu—Cu is bonded together through an annealing process with the temperature of 350-400° C. and the annealing time of 2 hours, so hybrid bonding with dielectric and metal is formed. However, the final annealing process takes too long, which seriously affects the production efficiency. In addition, since the thermal expansion coefficient of the Cu is much higher than that of the $SiO_2$ dielectric, at the annealing temperature of the Cu crystallization, the volume of the Cu will increase and may push out the already bonded dielectric around, resulting in defects and even the failure of the bonding process.

The above hybrid bonding technology has very marginal process control requirements for the Cu CMP process, the height of the Cu layer is required to be lower than that of the dielectric layer, and the recessed amount of the Cu is within 10 nm, which brings severe challenges to the process control in mass production.

BRIEF SUMMARY OF THE DISCLOSURE

To overcome the defects in the prior art, a hybrid bonding method between silicon wafers is provided to reduce the risk of dielectric stratification by reducing the annealing temperature of the metal, thereby reducing the difficulty of the process integration.

In order to achieve the aim, the invention provides a method for hybrid wafer-to-wafer bonding comprises the following steps:

S01: providing two silicon wafers with Cu pattern structures, a conventional Cu BEOL process is adopted on the silicon wafers to obtain the planarized surface with copper and dielectric;

S02: removing part of the Cu on the planarized surface of the Cu pattern structure by adopting an etching process to form a certain amount of Cu recesses;

S03: depositing a layer of bonding metal on the surface of the Cu by adopting a selective deposition process;

S04: performing surface activation on the bonding metal and the dielectric by adopting a surface activation process;

S05: aligning and pressing the two silicon wafers together to obtain the dielectric bonding;

S06, obtaining the metal bonding through the annealing process.

Preferably, the S01 comprises the following steps: depositing a layer of the dielectric on the surface of the silicon wafer substrates; adopting a photo lithography and an etching process to obtain Pad trenches; and performing a PVD process to deposit a barrier layer and a seed layer on the Pad trenches; the Cu is filled by an ECP process, and a planarization surface of the Cu and the dielectric is obtained by adopting a CMP process.

Preferably, the S02 comprises the following step: removing part of the Cu by adopting a wet etching process.

Preferably, the S02 comprises the following step: oxidizing the surface of the Cu by adopting an oxidation process and removing the oxidized Cu by adopting a wet etching process.

Preferably, in the S03, a chemical plating process is adopted to deposit the bonding metal on the copper surface.

Preferably, the bonding metal is Sn or Au.

Preferably, after the bonding metal is deposited in the S03, the height of the bonding metal is not higher than the height of the dielectric.

Preferably, the S04 comprises the following steps: firstly, activating the bonding metal and the dielectric by adopting plasma bombardment, and then carrying out surface cleaning by adopting a wet cleaning process.

Preferably, the dielectric bonding in the S05 is obtained at room temperature and normal pressure.

Preferably, the annealing process temperature of the S06 is within 200° C.

According to the method for the hybrid wafer-to-wafer bonding of the present invention, a part of the Cu on the surface of the Cu pattern structure is removed by adopting an etching process, the bonding metal is selectively deposited, and the lower crystallization temperature and the shorter annealing process time of the bonding metal are utilized, so as to that the sufficient metal bonding can be obtained at low annealing temperature, and the dielectric delaminating risk caused by thermal expansion mismatch is further reduced, the difficulty of the process integration is reduced, the process time is saved, and the product yield is improved.

DETAILED DESCRIPTION OF THE EMBODIMENTS

The contents of the present invention will be described in further detail below with reference to the accompanying drawings. The present invention can have various changes in different examples, is not separated from the scope of the invention, and the description and illustration thereof are intended to be illustrative in nature and not to limit the invention. It should be noted that the drawings both adopt a very simplified form and use a non-precise ratio, to facilitate the purpose of describing the embodiments of the present invention in a convenient and clear manner.

Figure 1:
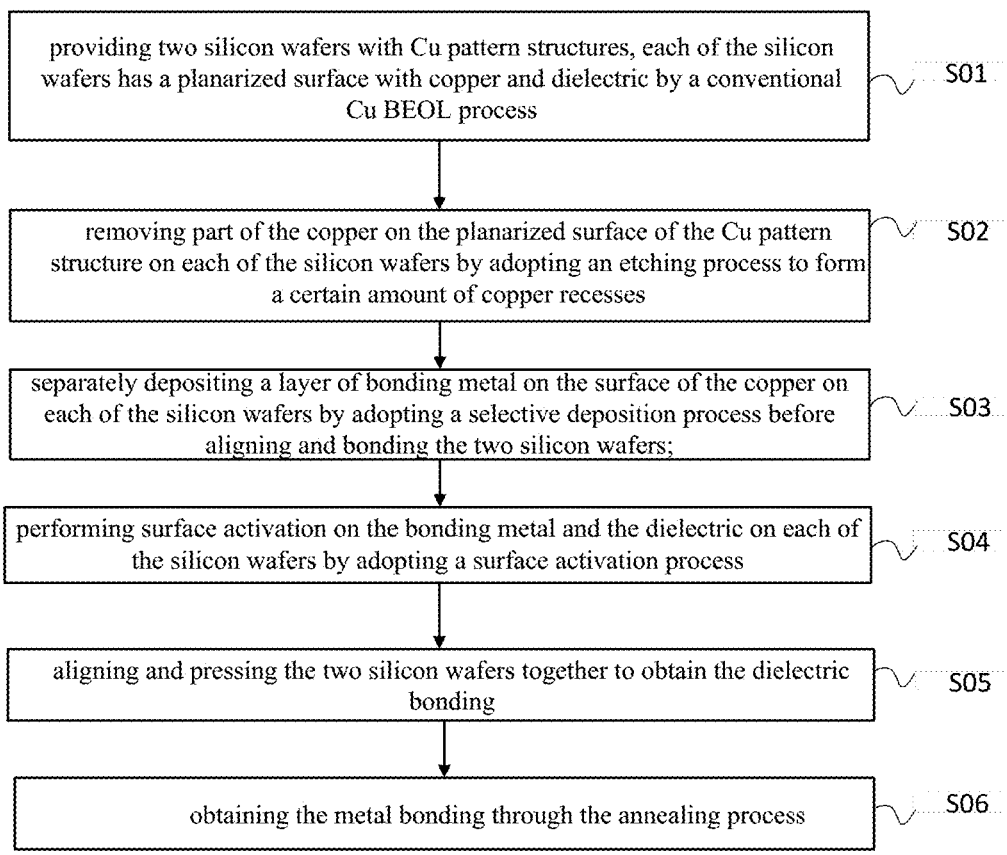
FIG. 1 is a flow chart of a method for hybrid wafer-wafer bonding according to the present invention

In the following detailed description of the present invention, please refer to FIG. 1, FIG. 1 is a flow chart of a method for hybrid wafer-wafer bonding according to the present invention. At the same time, please refer to FIGS. 2-7, FIGS. 2-7 are schematic views of a process for performing the hybrid bonding between two silicon wafers according to the method shown in FIG. 1. As shown in FIG. 1, the method for hybrid wafer-wafer bonding comprises the following steps:

S01: providing two silicon wafers with Cu pattern structures, a conventional Cu BEOL process is adopted on the silicon wafers to obtain the planarized surface with copper and dielectric.

Figure 2:
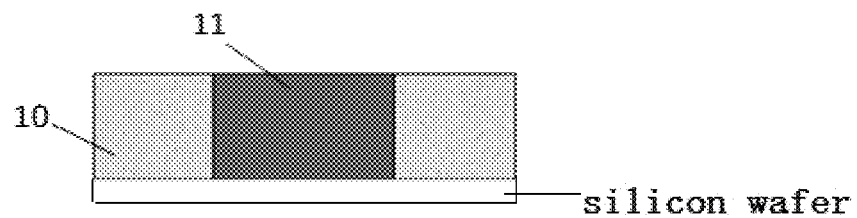
FIG. 2 to FIG. 7 are schematic views of a process for performing the hybrid bonding between two silicon wafers according to the method shown in FIG. 1

Referring to FIG. 2, firstly, a layer of Inter-Metal Dielectric 10 is deposited on the surface of the two silicon wafer substrates (not shown in the figure), wherein the material of the Inter-Metal Dielectric 10 may be pure silicon dioxide, doped silicon dioxide or low-k dielectric material. The Inter-Metal Dielectric 10 with appropriate k value can be selected according to different technical requirements, and the Inter-Metal Dielectric 10 can be deposited by PECVD (plasma enhanced chemical vapor deposition) and the like. Secondly, a pad pattern region can be defined on the surface of the Inter-Metal Dielectric 10 by a photolithography process. the photolithography process can be selected according to different integration density requirements, for example, the 193 nm photolithography technology can be adopted in the technical generation of 65 nm and below. Third, the pad trenches are obtained by adopting an etching process; the dielectric of the bonding pad pattern can be etched away by adopting a dry etching process, and then residues and photoresist can be removed by adopting a wet cleaning process. Fourth, a barrier layer and a seed layer can be sequentially deposited on the inner of the pad trenches by adopting a PVD process; in this way, the extremely thin Ta(N) barrier layer is generally deposited at first and then the continuous Cu seed layer is deposited. Fifth, an ECP (electroplating) process is used to fill the Cu material 11 into the pad trenches until the pad trenches are filled with Cu material 11, in addition, the thickness of the Cu material 11 provided is enough to ensure the requirement of the subsequent CMP process window, wherein the thickness of the Cu material 11 is generally 0.8-1.6 microns. Finally, the metal on the surface of the Pad trenches can be completely removed by adopting a standard Cu CMP process, and the planarized surface with copper and dielectric is obtained. The method has the advantages that the amount of Cu recesses is not strictly required.

S02: removing part of the Cu on the planarized surface of the Cu pattern structure by adopting an etching process to form a certain amount of Cu recesses.

Figure 3:
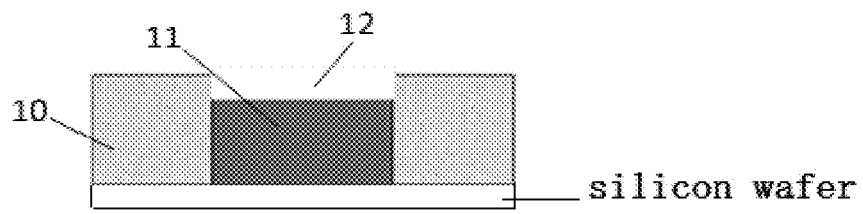

Referring to FIG. 3, in the etching process adopted to remove part of the Cu 11 on the pad pattern region of the two silicon wafers, the etching amount of the Inter-Metal Dielectric 10 is very small. On one hand, a common wet etching process can be used to achieve high-selectivity metal etching by using an $H_2SO_4/H_2O_2/H_2O$ mixed solution (SPM) as an etching agent. In order to reduce the etching speed and control the etching amount of the Cu, a low concentration ratio such as 1:1:98 can be adopted for SPM solution, and the etching rate of the Cu can be controlled at the level of dozens of angstroms per second. The low-concentration SPM solution is sprayed on the center of the silicon wafer substrate, and the whole silicon wafer is uniformly immersed by the SPM under the action of the spinning centrifugal force of the silicon wafer to obtain a relatively uniform etching effect.

On the other hand, the dry and wet etching processes can also be used to achieve more controllable etching process results. Firstly, a dry oxidation process is adopted, and the oxygen-containing plasma is used for carrying out controllable oxidation treatment on the Cu to form the contain copper oxide. The oxidation grade of the Cu and thickness of the copper oxide can be accurately controlled by process parameters such as reaction time, temperature and power. And then, a wet etching process is adopted, and the copper oxide is removed by using the diluted non-oxidizing acid, such as dilute hydrochloric acid which can only react with the copper oxide, and the Cu is not corroded. In this way, the etching amount of the Cu can be effectively controlled, so that a better etching process control effect is obtained.

There is no strict requirement for the etching amount of the Cu above, only the obvious depression 12 can be formed on the surface of the Cu in the pad pattern region.

S03: depositing a layer of bonding metal on the surface of the Cu by adopting a selective deposition process.

Figure 4:
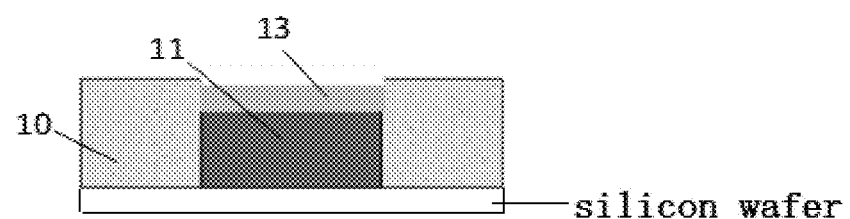

Please refer to FIG. 4, for the two silicon wafers mentioned above, only one layer of bonded metal 13 was deposited on the Cu by the selective deposition process. In order to reduce the process temperature of metal bonding, the Sn and Au can be used as the bonding metal. The Sn is a common bonding material in the packaging process, the hardness of the Sn is low, the melting point of the Sn is only 232° C. Because the recrystallization of the Sn can occur at the temperature below 200° C., the Sn is an ideal low-temperature bonding material. The Au and also is a common bonding material in the packaging process, the resistivity of the Au is slightly larger than that of the Cu, the melting point of the Au is close to that of the Cu, the coefficient of thermal expansion of the Au is lower than that of the Cu, the corrosion resistance of the Au is high, so the Au is an ideal bonding material. In addition, the temperature of the hot-press bonding process of the Au is generally above 300° C., there is a similar problem of thermal expansion mismatch of metal/dielectric, however the bonding temperature of the Au can be reduced to 150-200° C. under the surface activation of the Ar or the $N_2$ plasma, thus which is meeting the technical requirements of the invention.

For the bonding metal above, only the Sn or Au is deposited on the Cu surface by adopting the selective electroless plating process. Chemical tin plating and chemical gold plating belong to mature chemical technology. The chemical agents of the chemical plating cannot contain metal ions such as sodium and potassium when the chemical agent is applied to the field of semiconductors, the ammonia ions can be selected for replacing the metal ions, and the pH value the of the chemical agents is adjusted by using ammonia water. In addition, in order to obtain the selective electroless plating effect, the silicon wafer surface can be cleaned first; the native oxide layer on the surface of the Cu can be removed by using diluted hydrochloric acid and the organic residue on the surface can be removed by using alkaline ammonia water; then the palladium chloride alkaline liquid is used for plating a Pd (palladium) seed layer on the surface of the Cu only; and finally the metal is only deposited on the Pd seed layer by adopting a chemical plating process of the Sn or Au. Alternatively, DMAB (Dimethylamine broane) as the strong reducing agent can also be used to achieve direct selective electroless plating without the Pd seed layer as pre-coating, and only the bonded metal (Sn or Au) is plated on the surface of the Cu. In addition, the selective deposition of the bonding metal is performed in the S03, the height of the metal in the pad pattern region does not exceed the height of the dielectric, in order to prevent the dielectric in the alignment bonding process from not being in contact with each other, which cannot form the dielectric bonding. The final height of the bonding metal can be lower than 2-6 nanometers of the dielectric.

S04: performing surface activation on the bonding metal and the dielectric by adopting a surface activation process.

Figure 5:
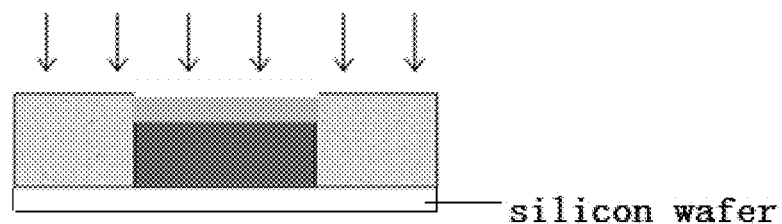

Referring to FIG. 5, a conventional $SiO_2$ dielectric bonding temperature is up to 900° C. or higher, which cannot be applied to a hybrid bonding process with the metal. Whereas, the Si—O bond can be broken through the plasma activation technology, the surface of the hydrophilic dielectric is formed, and the OH-dangling bond is conveniently obtained. When the two silicon wafers are in contact with each other, the surfaces of two silicon wafers are attracted and bonded together by the hydrogen bonding under normal temperature and normal pressure.

Since the hybrid bonding is performed on the surfaces of the metal and the dielectric simultaneously, the proper reaction gas should be selected in the surface activation process. In order to prevent the metal from being severely oxidized, the strong oxidizing gas such as oxygen cannot be selected, the inert gas or anti-oxidation gas such as Ar and $N_2$ and the like can be selected. According to the method, the nitrogen is used as an example, the nitrogen flow rate can be 50-200 sccm, and the vacuum degree of the process chamber is controlled to be 0.1-0.5 torr, the AC power is 50-100 watts, and the activating process time is 1-2 minutes. After the activation of bonded metal and the dielectric by plasma bombardment, a wet cleaning process is also needed. The DI water (deionized water) adopted concretely is sprayed on the centers of the two silicon wafers, and the surfaces of the two silicon wafers are uniformly cleaned under the action of the centrifugal force of the rotating silicon wafers, the activated surface dielectric reacts with water to form OH- dangling bonds, and form a layer of extremely thin water film on the surface of the silicon wafer.

S05: aligning and pressing the two silicon wafers together to obtain the dielectric bonding.

Figure 6:
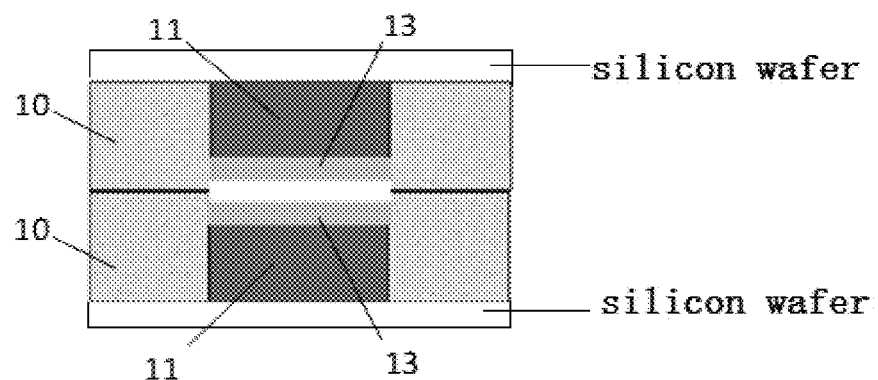

Please refer to FIG. 6, which is different from the common hot-press bonding, the dielectric bonding between two silicon wafers of the invention can be realized at room temperature and normal pressure through the precise optical mark alignment process after the plasma-activation process. In the bonding chamber, one silicon wafer faces up, the other silicon wafer faces down, and then the optical marks of the two silicon wafers are identified and aligned by the upper detection lens and lower detection lens, and the relative alignment positions of the upper and lower silicon wafers are confirmed; then the upper silicon wafer is slowly descended to approach the surface of the lower silicon wafer, and the two silicon wafers are tightly attached together, so the bonding between the dielectrics 10 of the two silicon wafers under the action of the hydrogen bond is realized.

S06: obtaining the metal bonding through the annealing process.

Figure 7:
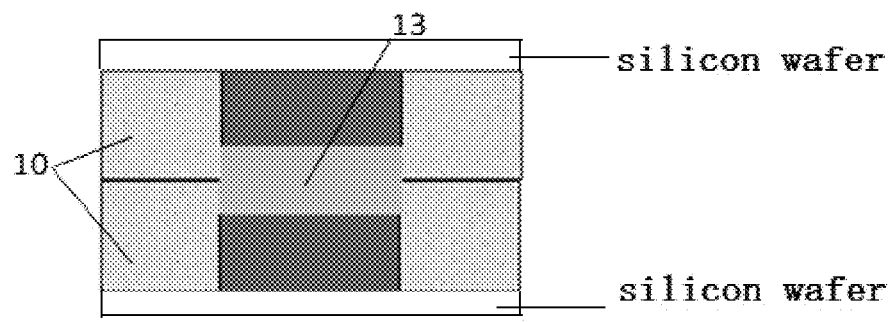

Referring to FIG. 7, the annealing process has two main functions, on one hand, the metal slightly expands, so that the bonding metal elements 13 on the two silicon wafers are in contact with each other and the metal bonding with good ohmic contact is formed through the recrystallization phenomenon; and on the other hand, the OH-bond of the dielectric bonding surface evaporates as water molecules, and the stronger Si—O—Si covalent bond is formed, so that the bonding strength is improved.

The temperature of the conventional Cu—Cu bonding process is about 350-400° C., and the annealing time is 2 hours. In order to reduce the risk of the dielectric delaminating due to thermal expansion mismatch, the bonding metal is subjected to surface activation by adopting a plasma activation technology, and the annealing temperature is controlled within 200° C. After $N_2$ plasma is activated, the annealing time is carried out for 20 minutes at the temperature of 180° C., the metal bonding of the metal Sn or Au can be realized. In this way, the annealing temperature is reduced, the annealing time is shortened, the process integration difficulty is reduced, and the process period is shortened.

To sum up, in the present invention, the part of the Cu on the surface of the Cu pattern structure by adopting copper etching process, the bonding metal is selectively deposited, and the lower crystallization temperature and the shorter annealing process time of the bonding metal are utilized, the sufficient metallic bonding can be obtained at the low annealing temperature, thereby the dielectric delaminating risk caused by thermal expansion mismatch is further reduced, the process integration difficulty is reduced, the process time is saved, and the product yield is improved.

The above descriptions are only embodiments of the present invention, and the embodiments are not intended to limit the scope of the present invention, therefore, the equivalent structure changes which are made by applying the specification and the drawings of the invention are applied, in the protection scope of the invention.

The invention claimed is:

1. A method for hybrid wafer-to-wafer bonding, wherein comprises the following steps in sequence:
    S01: providing two silicon wafers with Cu pattern structures, wherein each of the silicon wafers has a planarized surface with copper and dielectric by a conventional Cu BEOL process;
    S02: removing part of the copper on the planarized surface of the Cu pattern structure on each of the silicon wafers by adopting an etching process to form a certain amount of copper recesses;
    S03: separately depositing a layer of bonding metal on the surface of the copper on each of the silicon wafers by adopting a selective deposition process before aligning and bonding the two silicon wafers;
    S04: performing surface activation on the bonding metal and the dielectric on each of the silicon wafers by adopting a surface activation process;
    S05: aligning and pressing the two silicon wafers together to obtain the dielectric bonding;
    S06, obtaining the metal bonding through the annealing process.

2. The method for hybrid wafer-to-wafer bonding according to claim 1, wherein, the S01 comprises the following steps: depositing a layer of the dielectric on the surface of the silicon wafer substrates; adopting a photo lithography and an etching process to obtain Pad trenches; and performing a PVD process to deposit a barrier layer and a seed layer on the Pad trenches; the copper is filled by an ECP process, and a planarization surface of the copper and the dielectric is obtained by adopting a CMP process.

3. The method for hybrid wafer-to-wafer bonding according to claim 1, wherein the S02 comprises the following step: removing part of the copper by adopting a wet etching process.

4. The method for hybrid wafer-to-wafer bonding according to claim 1, wherein, the S02 comprises the following step: oxidizing the surface of the copper by adopting an oxidation process and removing the oxidized copper by adopting a wet etching process.

5. The method for hybrid wafer-to-wafer bonding according to claim 1, wherein, in the S03, a electroless plating process is adopted to deposit the bonding metal on the copper surface.

6. The method for hybrid wafer-to-wafer bonding according to claim 1, wherein, the bonding metal is Sn or Au.

7. The method for hybrid wafer-to-wafer bonding according to claim 1, wherein, after the bonding metal is deposited in the S03, the height of the bonding metal is not higher than the height of the dielectric.

8. The method for hybrid wafer-to-wafer bonding according to claim 1, wherein, the S04 comprises the following steps: firstly, activating the bonding metal and the dielectric by adopting plasma bombardment, and then carrying out surface cleaning by adopting a wet cleaning process.

9. The method for hybrid wafer-to-wafer bonding according to claim 1, wherein, the dielectric bonding in the S05 is obtained at room temperature and normal pressure.

10. The method for hybrid wafer-to-wafer bonding according to claim 1, wherein, the annealing process temperature of the S06 is within 200° C.

* * * * *